United States Patent
Tiziani et al.

(10) Patent No.: US 6,815,789 B2
(45) Date of Patent: Nov. 9, 2004

(54) SEMICONDUCTOR ELECTRONIC DEVICE AND METHOD OF MANUFACTURING THEREOF

(75) Inventors: Roberto Tiziani, Milan (IT); Carlo Passagrilli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/319,441

(22) Filed: Dec. 13, 2002

(65) Prior Publication Data

US 2003/0127701 A1 Jul. 10, 2003

(30) Foreign Application Priority Data

Dec. 14, 2001 (EP) .............................. 01830768

(51) Int. Cl.[7] .............................................. H01L 29/72
(52) U.S. Cl. ...................... 257/459; 257/460; 257/463; 257/781; 257/787; 257/678; 257/690
(58) Field of Search ................. 257/459, 460, 257/463, 781, 787, 678, 690

(56) References Cited

U.S. PATENT DOCUMENTS

| 4,205,099 A | 5/1980 | Jones et al. .................... 427/90 |
| 5,583,073 A | 12/1996 | Lin et al. ..................... 439/183 |
| 6,586,677 B2 * | 7/2003 | Glenn ......................... 257/781 |
| 2003/0119299 A1 * | 6/2003 | Jiang et al. ................. 257/459 |

FOREIGN PATENT DOCUMENTS

| DE | 199 14 338 | 10/2000 |
| EP | 1 006 576 | 7/2000 |

* cited by examiner

Primary Examiner—Edward Wojciechowicz
(74) Attorney, Agent, or Firm—Allen, Dyer, Doppelt Milbrath & Gilchrist, P.A.; Lisa K. Jorgenson

(57) ABSTRACT

A semiconductor electronic device includes a die of semiconductor material and a support. The die of semiconductor material includes an integrated electronic circuit and a plurality of contact pads associated with the electronic circuit and connected electrically to the support by wire leads. Each contact pad may include a lower layer of aluminum, copper, or alloys thereof, and an upper layer including at least one film of a metal and/or metallic alloy including nickel, palladium, or alloys thereof, and being deposited by an electroless chemical process.

22 Claims, 1 Drawing Sheet

SEMICONDUCTOR ELECTRONIC DEVICE AND METHOD OF MANUFACTURING THEREOF

FIELD OF THE INVENTION

The present invention broadly relates to an electronic device of a type that comprises a die of semiconductor material connected by wire leads to a support, or an integrated circuit having electrically conductive areas or regions. In particular, the invention relates to such an electronic device exhibiting high performance and reliability especially, but not solely, under high temperature conditions. The invention further relates to a method of fabricating such a semiconductor electronic device.

BACKGROUND OF THE INVENTION

As is well known, a semiconductor electronic device, e.g. a power device, comprises a small plate of a semiconductor material known as the "die", which has a surface area of a few square millimeters and has an electronic circuit integrated monolithically therein. The die has a plurality of terminals, typically in the form of surface contact pads, that are connected electrically to a support which is also a part of the electronic device. This support is known as the "lead frame" and can be provided in different forms, including ceramic substrates, printed circuit boards, pliant circuits, and silicon-based substrates.

The aggregate of the die and the support is encased into a "package" for heat and mechanical protection of the electronic device, both during storage and in use. The package case is typically a plastic material.

Different technologies may be used to connect the die of semiconductor material electrically to the support, of which a commonly used one provides for the use of wire leads and is known as "wire bonding". In particular, each wire is soldered with one end on a contact pad formed on the die of semiconductor material, and with the other end on a contact pad correspondingly formed on the support to which the die is connected.

The contact pads of a die of semiconductor material are typically made of aluminum or an aluminum alloy, for manufacturing convenience and performance of the device. The wires are usually gold, copper, or alloys thereof, because these materials alloy well with aluminum.

Although semiconductor electronic devices of the above type are advantageous, they have serious drawbacks in that their reliability may be low and their performance may deteriorate rapidly in high-temperature applications. For instance, it is known that power electronic devices are largely used in many automobile vehicles in electronic control units for controlling the operation of engine, drive, and brake systems. These control units are made smaller and smaller in size and include an ever-growing number of functions. This results in increased power density and consequently increased heat generated from the integrated circuits.

With electronic or generic discrete devices, this heat is normally dissipated through their packages, which are designed to also serve this purpose. The heat may additionally or alternately be dissipated using suitable heat sinks.

However, the packages of power electronic devices used in automotive control units, especially those used in engine control units, are not typically able to dissipate the heat properly due to the high ambient temperature (usually above 100° C.) to which the control units and consequently the semiconductor devices therein are exposed. Under this working condition, the performance and reliability of the electronic devices deteriorate rapidly during the device life span, which is therefore not high.

More particularly, it is found that when the above electronic devices are operated at high ambient temperatures (above 140° C.) with electric currents close to their designed maximum, the electrical resistance of the wire-to-pad connection of the die of semiconductor material increases dramatically with time. This behavior has been investigated in more detail, and it has been determined that, in the above conditions, it is caused by a continuous migration of gold atoms from the wire lead into the underlying aluminum layer that forms the contact pad. Therein, the gold atoms "use up" aluminum from the contact pad producing with it a gold/aluminum intermetallic compound that has a high electrical resistance.

It has been further determined that, when a package of an epoxy resin formulated with bromine and antimony-containing fire retardants is used, the above diffusion of gold atoms associates with the formation of voids at the interface between the gold and the aluminum layer thereunder. These voids are responsible for a progressive mechanical deterioration of the soldered joint thereby eventually causing the wire lead to become detached from the contact pad on the die. This behavior is promoted by the bromine and the antimony provided in the composition of the epoxy resin in the package.

Similar problems to those just described also appear, although over a somewhat longer period, when copper wires are used instead of gold ones and/or when the electrical resistance of the wire-to-pad connection of the die of semiconductor material is increased.

Thus, there exists a demand for semiconductor electronic devices, specifically power devices, which should be highly reliable and capable of satisfactory lifelong performance in applications involving high temperature conditions. This demand is more pressing since automotive technology is moving in the direction of installing the control unit directly on, or very close to, the actuating system, that is to say the engine, drive, or brake system. This means that the semiconductor electronic devices of such control units will be required to withstand still higher operating temperatures and, at the same time, also withstand increased shock loads and vibration.

SUMMARY OF THE INVENTION

In view of the foregoing background, it is an object of the present invention to provide a semiconductor electronic device with appropriate structural and functional features to overcome the aforementioned drawbacks of the prior art and fill the above demand.

The problem is addressed according to the present invention by providing a semiconductor electronic device that comprises a die of semiconductor material and a support, the die of semiconductor material including an integrated electronic circuit and a plurality of contact pads associated with the electronic circuit and connected electrically to the support by wire leads. Each contact pad of the plurality of contact pads may comprise: a lower layer of aluminum, copper, or alloys thereof; and an upper layer comprising at least one film of a metal or a metallic comprising nickel, palladium, and alloys thereof. In a preferred embodiment of the invention, the lower layer may be aluminum or an alloy thereof, and the upper layer comprises overlaid zinc, nickel and gold films.

In another preferred embodiment of the invention, the lower layer is aluminum or an alloy thereof, and the upper layer comprises a palladium film and an optional gold film overlaid thereon.

In another preferred embodiment of the invention, the lower layer is aluminum or an alloy thereof, and the upper layer comprises overlaid films of zinc, nickel, palladium, and optionally gold.

In another preferred embodiment of the invention, the lower layer is copper or an alloy thereof, and the upper layer comprises overlaid nickel and gold films.

In another preferred embodiment of the invention, the lower layer is copper or an alloy thereof, and the upper layer comprises a palladium film optionally overlaid with a gold film.

In another preferred embodiment of the invention, the lower layer is copper or an alloy thereof, and the upper layer comprises overlaid nickel, palladium, and optionally gold films.

In the semiconductor device of this invention, each contact pad on the die of semiconductor material is intended for connection to a corresponding contact pad on a support by a soldered wire, preferably a wire of gold, copper, or alloys thereof. The connection of a contact pad to the lead wire can be obtained by soldering the outermost metal film of the upper layer, i.e. the palladium or gold film, to one end of the lead wire. Alternately, according to the invention, on the outermost film of the upper layer could be formed a soldering protuberance or bump, of gold, copper, or alloys thereof, which would be soldered onto the outermost film in the upper layer and to one end of the wire.

It has been unexpectedly found that by forming contact pads with layers of the above materials on the die of semiconductor material, a semiconductor electronic device according to the invention is obtained which has performances more consistent with time, even at high working temperatures, and a life span extended above that of prior devices under the same temperature conditions.

More particularly it has been found that in the use of electronic device of this invention, nickel and/or palladium films in the upper layer of the contact pads effectively block the migration of metal atoms from the wire lead and its soldering bump, if any, as well as that of gold or gold alloy atoms from the optional outermost film on the contact pads toward the lower layer of aluminum, copper, or alloys thereof, thereby preventing the formation of highly resistive intermetallic compounds. This atom blocking action is also effective when the semiconductor device of this invention is operated at high temperatures and high currents. The semiconductor electronic device of this invention is advantageous in that it can be used for power applications, such as automotive control units, and any other applications involving high working temperatures.

To provide the aforementioned atomic migration blocking action, the thickness of the film of nickel, or alloys thereof, should be at least 1 micron, preferably 1 to 20 microns, in the semiconductor device of this invention. When a palladium film is used, alone or in combination with the nickel film, a palladium film 0.1 to 3 microns thick is preferred for an effective blocking action.

In the semiconductor device of this invention, the thickness of the film of gold or gold alloys is preferably from 0.1 micron to 3 micron to guarantee an efficient bonding between the contact pad and the metal wire. The film of gold or gold alloy may be important when only nickel films are used to guarantee atomic migration blocking action.

In the semiconductor device of this invention, the thickness of the lower layer of aluminum, copper, or alloys thereof, is preferably 0.7 to 10 microns. When nickel films are used, it is important that the lower layer of aluminum, copper, or alloys thereof, be covered with a zinc film having a thickness of 0.05 to 0.3 microns, to assist in depositing the nickel onto the lower layer.

This invention also relates to a process for fabricating a semiconductor electronic device comprising a die of semiconductor material and a support, wherein the die of semiconductor material includes an integrated electronic circuit and a plurality of contact pads associated with the electronic circuit and connected electrically to the support by wire leads. The process is characterized in that each contact pad of the plurality of contact pads is formed by the steps described above.

Preferably, in the process of this invention the steps of depositing the above-described lower layer and metal films are carried out by electroless deposition. This deposition is conventional and comprises the steps of dipping the die in a plating bath containing ions of the metal to be deposited, and chemically reducing the bath ions to cause a film of the metal to deposit over exposed surface portions of the die, or over the surface of a film or metal layer previously deposited on such exposed surface portions. In practice, on completion of each metal depositing operation, the deposited layer or metal film will overlie an exposed surface portion of the die or a surface of a film or metal layer previously deposited on such exposed surface portions.

In a preferred embodiment of the invention, the process further comprises the step of depositing a soldering bump of gold, copper, or alloys thereof, over the outermost film of the contact pad, namely over the palladium or the gold film. The soldering bump may be deposited by conventional methods, preferably using thermosonic or ultrasonic energy. According to these methods, the material of the soldering bump is supplied through a capillary duct and soldered on the contact pad by the application of ultrasonic energy in combination with heat.

BRIEF DESCRIPTION OF THE DRAWINGS

Additional advantages of the semiconductor electronic device of this invention will become apparent from the following detailed description of an embodiment thereof, given by way of non-limitative example with reference to the accompanying drawing.

DETAILED DESCRIPTION OF THE PREFERRED EMBODIMENTS

Figure 1:
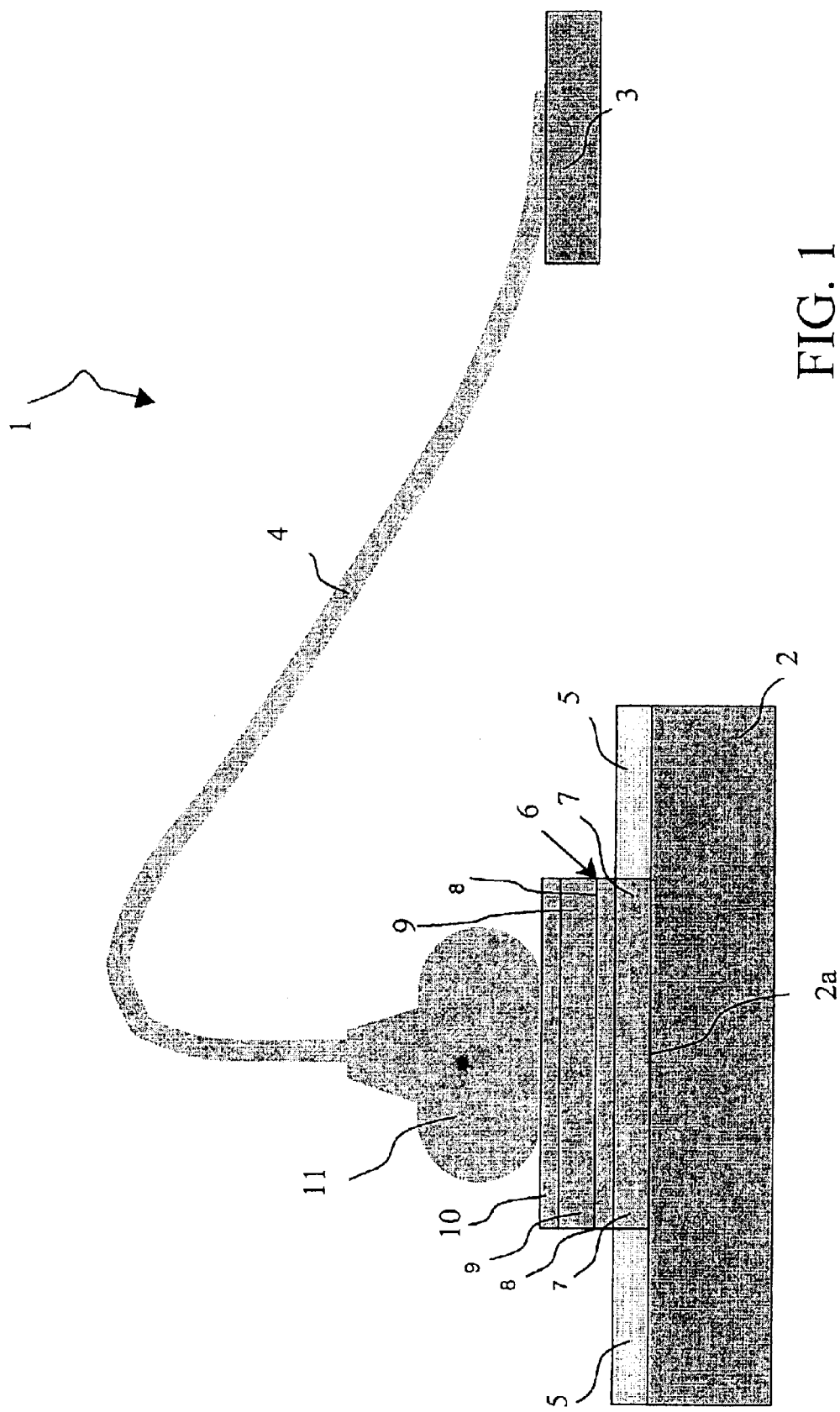
FIG. 1 is a cross-sectional view of a portion of a semiconductor electronic device according to the invention.

With reference to FIG. 1, a semiconductor electronic device according to the invention is shown generally at 1. The device 1 comprises a die 2 of a semiconductor material, which is connected electrically to a support 3 by wire leads 4. Shown in FIG. 1 is one wire lead 4 only, for simplicity. The die 2 includes an integrated electronic circuit (not shown) and is coated with a layer 5 of an insulating material. This insulating layer 5 has a plurality of openings to expose portions 2a of a surface of the die 2 on which respective contact pads are formed for connecting the die 2 and the support 3 electrically together. For simplicity, FIG. 1 shows only one portion 2a of the exposed surface of the die 2 where a contact pad is formed as generally shown at 6.

The contact pad 6 comprises a lower or pad layer 7 of aluminum, copper, or alloys thereof, and an upper layer on top of the lower layer 7. In the embodiment of FIG. 1, the upper layer comprises a first film 8 of zinc completely overlying the lower or pad layer 7 of aluminum, copper, or alloys thereof; a second layer 9 of nickel, or alloys thereof, completely overlying the zinc film 8; and a third film 10 of gold, or alloys thereof, completely overlying the second film 9 of nickel, or alloys thereof.

According to the invention, the second film 9 may be of palladium instead of nickel. In this case, the first film 8 of zinc and optionally the third film 10 of gold, or alloys thereof, can be omitted. Also, dual films, of nickel and palladium with the palladium film to overlie the nickel film completely, may be substituted for the second film 9 of palladium or nickel.

When a pad layer 7 of copper, or alloys thereof, is used, the second film 8 of zinc can be omitted regardless of the nature of the metal film (nickel, palladium, or alloys thereof) that is applied directly on the layer 7 of copper, or alloys thereof.

In the embodiment shown in FIG. 1, the contact pad 6 also includes a soldering bump 11 of gold, copper, or alloys thereof. The soldering bump 11 is soldered downward onto the outermost metal film of the contact pad 6, i.e. on the third film 10 of gold, or alloys thereof, and upward to one end of the wire lead 4, the other end of the wire lead being soldered on a contact pad (not shown) of the support 3. In those embodiments where the third film of gold or alloys thereof is omitted, the soldering bump 11 would be soldered on a film of palladium or alloys thereof.

EXAMPLE 1

Contact pads 6 were formed by the inventive method, on a die 2 of semiconductor material, to the following specifications:

pad layer 7 of aluminum, 3.7 microns thick;
first film 8 of zinc, 0.1 microns thick;
second film 9 of nickel, 5 microns thick; and
third film 10 of gold, 0.5 microns thick.

The resulting contact pads 6 were connected electrically into a so-called daisy chain by gold wire leads having a diameter of 50.8 microns (2 mils). This produced the semiconductor electronic device of this invention, which was then encased to obtain a 25-pin package.

The reliability of the electronic device of the invention was tested by measuring the resistance increase ($\Delta R/R$) with time of the daisy chain at a setting temperature of 180° C. and an electric current of 2.5 A.

The results of these measurements showed that the electronic device of this invention was highly reliable and had constant performances for over 6000 hours. During this period, no significant increase in resistance was observed across any of the circuit components, especially the contact pads.

The reliability of the device of this invention was compared to that of three conventional electronic devices, each having a die of semiconductor material formed with contact pads to the following specifications:

lower or pad layer of aluminum, 3 microns thick; and
gold wire soldered on the aluminum pad by a thermosonic process.

The three conventional devices, hereinafter referred to as Sample 1, Sample 2 and Sample 3, differed from one another by the material of their packaging cases. The packaging process was completed after connecting the contact pads of each sample device into a daisy chain as previously explained. The packaging materials of Samples 1, 2, 3 were as follows:

Sample 1: ECN (Epoxy Cresol Novolac) epoxy resin having a low bromine/antimony content; and Sample 2: diphenol resin having a standard bromine/antimony content;

Sample 3: diphenol resin free of bromine and antimony.

Samples 1, 2, 3 were tested for reliability by measuring the increase in resistance ($\Delta R/R$) with time of the daisy chain at a setting temperature of 180° C. and an electric current of 2.5 A.

The results of these measurements showed, for the compared sample devices, a sharp increase of resistance with time across the contact pads and a concurrent sinking of the reliability and performance levels. In practice, Sample 1 went out of operation after 200 hours, Sample 2 after 100 hours, and Sample 3 after 800 hours.

EXAMPLE 2

Contact pads 6 were formed by the inventive method, on a die 2 of semiconductor material, to the following specifications:

pad layer 7 of aluminum, 3.7 microns thick;
first film 8 of palladium, 2.0 microns thick; and
second film 9 of gold, 0.5 micron thick.

The resulting contact pads 6 were connected electrically into a so-called daisy chain by gold wire leads having a diameter of 50.8 microns (2 mils). This produced the semiconductor electronic device of this invention, which was then encased to obtain a 25-pin package.

The electronic device of the invention was tested for reliability by the same procedure as in Example 1. The device of this invention showed to have constant performances and reliability at a temperature of 180° C. and current of 2.5 A, for a time longer than 4000 hours.

That which is claimed is:

1. A semiconductor device comprising:
   a die comprising an integrated electronic circuit and a plurality of contact pads associated therewith;
   a support for said die; and
   a plurality of wire leads electrically connecting said support to said contact pads;
   each contact pad comprising
   a lower layer comprising at least one of copper, and alloys thereof, and
   an upper layer adjacent the lower layer and comprising at least one of nickel, palladium, and alloys thereof.

2. A semiconductor device according to claim 1 wherein said upper layer further comprises an outermost film comprising at least one of gold and alloys thereof.

3. A semiconductor device according to claim 2 wherein said outermost film has a thickness in a range of 0.1 to 3 microns.

4. A semiconductor device according to claim 1 wherein said lower layer has a thickness in a range of 0.7 to 10 microns.

5. A semiconductor device according to claim 1 wherein said upper layer consists essentially of nickel.

6. A semiconductor device according to claim 5 wherein said upper layer has a thickness in range of 1 to 20 microns.

7. A semiconductor device according to claim 1 wherein said upper layer consists essentially of palladium.

8. A semiconductor device according to claim 7 wherein said upper layer has a thickness in a range of 0.1 to 3 microns.

9. A semiconductor device according to claim 1 wherein said upper layer comprises a first film consisting essentially of nickel overlying said lower layer, and a second film consisting essentially of palladium overlying said first film.

10. A semiconductor device according to claim 9 wherein said first film has a thickness in a range of 1 to 20 microns; and wherein said second film has a thickness in a range of 0.1 to 3 microns.

11. A semiconductor device according to claim 1 further comprising a soldering bump comprising gold overlying said upper layer.

12. A semiconductor device comprising:
- a die comprising an integrated electronic circuit and a plurality of contact pads associated therewith;
- a support for said die; and
- a plurality of wire leads electrically connecting said support to said contact pads;
- each contact pad comprising
  - a lower layer comprising at least one of copper, and alloys thereof, and
  - an upper layer adjacent the lower layer and comprising at least one of palladium and alloys thereof.

13. A semiconductor device according to claim 12 wherein said upper layer further comprises an outermost film comprising at least one of gold alloys thereof.

14. A semiconductor device according to claim 13 wherein said outermost film has a thickness in a range of 0.1 to 3 microns.

15. A semiconductor device according to claim 12 wherein said lower layer has a thickness in a range of 0.7 to 10 microns.

16. A semiconductor device according to claim 12 wherein said upper layer consists essentially of palladium.

17. A semiconductor device according to claim 16 wherein said upper layer has a thickness in a range of 0.1 to 3 microns.

18. A semiconductor device according to claim 12 wherein said upper layer comprises a first film consisting essentially of nickel overlying said lower layer, and a second film consisting essentially of palladium overlying said first film.

19. A semiconductor device according to claim 18 wherein said first film has a thickness in a range of 1 to 20 microns; and wherein said second film has a thickness in a range of 0.1 to 3 microns.

20. A semiconductor device according to claim 18 wherein said lower layer consists essentially of aluminum; and wherein said upper layer further comprises a third film comprising at least one of zinc and alloys thereof between said lower layer and said first film.

21. A semiconductor device according to claim 20 wherein said third film has a thickness in a range of about 0.1 to 3 microns.

22. A semiconductor device according to claim 12 further comprising a soldering bump comprising gold overlying said upper layer.

* * * * *